United States Patent
Hannum et al.

(10) Patent No.: US 8,129,091 B2
(45) Date of Patent: Mar. 6, 2012

(54) METHOD FOR PREPARING A COMPOSITE PRINTING FORM USING A TEMPLATE

(75) Inventors: Robert W. Hannum, Hockessin, DE (US); Thomas Klein, Wolfenbuettel (DE)

(73) Assignee: E.I. du Pont de Nemours and Company, Wilmington, DE (US)

( * ) Notice: Subject to any disclaimer, the term of this patent is extended or adjusted under 35 U.S.C. 154(b) by 443 days.

(21) Appl. No.: 12/465,293

(22) Filed: May 13, 2009

(65) Prior Publication Data

US 2009/0297985 A1  Dec. 3, 2009

Related U.S. Application Data

(60) Provisional application No. 61/130,180, filed on May 28, 2008.

(51) Int. Cl.
  *G03F 7/00* (2006.01)
  *B41M 5/00* (2006.01)

(52) U.S. Cl. ............ 430/302; 430/306; 430/281.1; 101/463.1

(58) Field of Classification Search .......... 430/302, 430/964, 306, 944, 273.1, 281.1; 101/463.1
  See application file for complete search history.

(56) References Cited

U.S. PATENT DOCUMENTS

| | | | |
|---|---|---|---|
| 4,179,990 A | 12/1979 | Radencic | |
| 5,439,328 A | 8/1995 | Haggerty et al. | |
| 5,560,297 A | 10/1996 | Ford | |
| 5,607,814 A * | 3/1997 | Fan et al. | 430/258 |
| 5,661,566 A | 8/1997 | Gerber | |
| 5,846,691 A | 12/1998 | Cusdin et al. | |
| 5,850,789 A | 12/1998 | Rudolf et al. | |
| 6,312,871 B1 | 11/2001 | Cusdin et al. | |
| 6,312,872 B1 | 11/2001 | Murphy et al. | |
| 6,352,815 B1 * | 3/2002 | Feil et al. | 430/306 |
| 6,399,281 B1 | 6/2002 | Cusdin et al. | |
| 6,472,121 B2 | 10/2002 | Murphy et al. | |
| 6,604,465 B2 * | 8/2003 | Tice et al. | 101/415.1 |
| 6,823,793 B2 | 11/2004 | Dewitte | |
| 6,948,432 B2 | 9/2005 | Dewitte | |
| 7,029,805 B2 * | 4/2006 | Ray et al. | 430/5 |
| 7,171,901 B2 * | 2/2007 | Salvestro | 101/401.1 |
| 7,279,254 B2 * | 10/2007 | Zwadlo | 430/5 |
| 7,682,775 B2 * | 3/2010 | Rapp et al. | 430/302 |
| 7,819,060 B2 * | 10/2010 | Taylor et al. | 101/486 |
| 8,009,330 B2 * | 8/2011 | Dardikman et al. | 358/3.29 |
| 2008/0213786 A1 * | 9/2008 | Hurez et al. | 435/6 |
| 2009/0199733 A1 * | 8/2009 | Dudek et al. | 101/463.1 |
| 2011/0039211 A1 * | 2/2011 | Hannum et al. | 430/306 |
| 2011/0217656 A1 * | 9/2011 | Taguchi et al. | 430/270.1 |

FOREIGN PATENT DOCUMENTS

| | | |
|---|---|---|
| EP | 0 741 330 A1 | 6/1996 |
| GB | 1 149 203 | 4/1969 |

* cited by examiner

*Primary Examiner* — Amanda C. Walke
(74) *Attorney, Agent, or Firm* — Thomas H. Magee

(57) ABSTRACT

The invention pertains to a method for preparing a composite printing form from a photosensitive element and a carrier using a template. The photosensitive element is located on the carrier by positioning the element through cutout portions in the template. The method is particularly suited for preparing composite printing forms for relief printing, and in particular for preparing composite printing forms for flexographic printing of corrugated substrates.

15 Claims, No Drawings

METHOD FOR PREPARING A COMPOSITE PRINTING FORM USING A TEMPLATE

BACKGROUND OF THE INVENTION

1. Field of the Disclosure

This invention pertains to a method for the preparation of composite printing forms, and particularly for the preparation of composite printing forms for use in relief printing.

2. Description of Related Art

Flexographic printing plates are widely used for printing of packaging materials including corrugated carton boxes, cardboard boxes, continuous web of paper, and continuous web of plastic films. Flexographic printing plates are a form of relief printing in which ink is carried from a raised-image surface and transferred to a substrate. Flexographic printing plates can be prepared from photopolymerizable compositions that typically include an elastomeric binder, at least one monomer, and a photoinitiator, such as those described in U.S. Pat. Nos. 4,323,637 and 4,427,759. The photosensitive elements generally have a solid layer of the photopolymerizable composition interposed between a support and a coversheet or a multilayer cover element.

Corrugated boxes and other, relatively large objects that are printed using relief image printing plates often bear actual printing on only a small portion of their total surface area. Those skilled in the art often print relatively large objects with composite printing plates that are prepared by mounting a plurality of relief image printing plates on a common carrier sheet. The individual plates, however, are mounted only on those portions of the carrier that correspond to the portions of the object that actually need to be printed. However, this system for mounting constituent relief image plates is laborious and requires careful adhesion of the plates to the carrier while assuring accurate registration on press for high quality printing and multi-color reproduction. For multi-color reproduction, wherein a single plate is used for printing each of the individual colors, accurate registration of the plates with respect to one another is particularly crucial.

Other methods of preparing composite printing plates have been suggested, such as in U.S. Pat. Nos. 5,846,691; 6,312,871; 6,312,872; 6,399,281; and 6,472,121, which do not require precise registration of constituent photocurable elements. Generally the methods involve disposing at least one photocurable element upon a surface of a carrier in approximate register and then transferring a computer generated negative to a surface of the elements. The methods include transferring registration information of any visually perceptible modification of the printing element, i.e., carrier, that is intended to reflect positioning of the photocurable elements. The negative or mask may be generated by jetting ink onto the surface of the element or by exposing with laser radiation to selectively remove a radiation opaque layer from the surface of the element.

Another way to print corrugated board and other large objects is to prepare a single relief image plate having a surface area corresponding to the total surface area of the object. Since only portion of the object's surface needs to be printed, however, only a portion of the relief image plate will actually be used for ink transfer. The remainder of the plate will be unused, and is removed by washout processing at the same time as the portion/s of the relief image is being formed. However, removal of the unused portion places extreme stress on the washout apparatus and on the relief image plate. As such, large unused portions, i.e., unimaged portions, are cut away prior to treating.

It is desirable to assure the accurate positioning of the relief printing form or forms when mounting onto the print cylinder or onto the carrier in order for the printed image/s on the substrate to be registered. The relief printing form should be positioned on the cylinder such that the printing is parallel to the axis of the printing cylinder, that is, not skewed. In multicolor printing, the relief printing form for each color being printed should be aligned so that the different color printed images are registered with each other. Registration errors give rise to superimposed colors, spaces with no color, color shifts, and/or degraded image detail.

Even with these prior methods, there remains a need in the art for alternative processes for preparing composite printing forms. In particular, there remains a need for alternative, easy to use, process for accurate registration of the constituent relief image printing plates on the composite printing form.

SUMMARY

In accordance with this invention there is provided a method for preparing a composite printing form, including:
a) providing a photosensitive element comprising a layer of a photopolymerizable composition and an infrared sensitive layer disposed above the photopolymerizable layer;
b) forming a template from a sheet by removing a portion of the sheet to form a cut-out portion;
c) positioning the template adjacent a carrier;
d) securing the element to the carrier by inserting the element within the cut-out portion of the template;
e) imagewise exposing the infrared sensitive layer with infrared laser radiation to form a mask on the element;
f) overall exposing the element to actinic radiation through the mask; and
g) treating the element of f) to form a relief structure on the carrier.

DESCRIPTION OF THE PREFERRED EMBODIMENTS

The present invention is a method for preparing a composite printing form from at least one photosensitive element and a carrier using a template. The method is particularly suited for preparing composite printing forms for relief printing, and in particular for preparing composite printing forms for flexographic printing of corrugated substrates. A composite print element is prepared by mounting at least one photosensitive element on a face of the carrier in accordance with basic registration information carried by the template in at least one cut-out portion.

The present invention provides a method that eliminates the tedious requirement of having to hand-register individual relief printing elements in preparing composite printing forms. Particularly in some end-use applications of corrugated board printing, only relatively small areas of the corrugated substrate needs to be printed compared to the overall size of the component being formed from the corrugated substrate. As such it is desirable to selectively mount one or more portions of a photosensitive element on a carrier only at the location/s required for printing. According to the inventive method, one or more photosensitive elements of suitable sizes required are mounted on a carrier in approximate position, but not in register, to areas that will ultimately print a substrate. Precise registration of the at least one photosensitive element then is achieved by formation of a mask image using digital information generated from a computer to the composite form. This also avoids the complexity of prior methods that include registration markings in the relief image of each of the photosensitive elements for alignment with markings on the carrier. Also, the present invention can easily be integrated in usual production processes for composite printing forms. No additional apparatus is necessary to accomplish the present method. A digital converting table apparatus, which is already used for plotting, cutting, and creasing of corrugated board and other rigid materials for packaging and displays, can be used for the present process, particularly for forming the template. The present method of preparing a composite printing form by using a template with a cut-out portion within which the photosensitive element is inserted for positioning on the carrier provides several additional advantages, particularly compared to prior methods which directly mark the carrier to locate the photosensitive element. The use of a template can conserve on materials consumed, and reduce the cost of materials and/or the time to prepare composite printing forms. The template can be reused for preparing subsequent composite printing forms having the same or similar design feature, that is, for composite printing forms which will have at least one photosensitive element at the same or substantially the same location on the carrier. This can also reduce the preparation time for the subsequent composite printing forms since there is no need to mark the subsequent carrier. The carrier can also be re-used to prepare subsequent printing forms since the carrier will not having any markings to confuse the position of the subsequent photosensitive elements. Furthermore, operators in customer shops can more easily use the template with cut-out portion than the carrier to determine if unused or scrap portions of photosensitive elements that remain from prior jobs, are suitable for preparing a current composite printing form. Templates suitable for use in the present invention are, in most embodiments, light-weight sheets of film that can be easily moved to and positioned on the scrap photosensitive elements. Whereas carriers can be cumbersome to move and position on the scrap photosensitive elements since carriers are often made from materials that are weigh more (than the sheet for the template) and have more bulk due to the size of the carrier.

The photosensitive element that is used for preparing composite printing forms for relief printing includes at least one photopolymerizable layer. In most embodiments, the photosensitive element that is used for preparing composite printing forms for relief printing includes a support and the at least one photopolymerizable layer adjacent the support. The photopolymerizable layer is an elastomeric layer that includes a binder, at least one monomer, and a photoinitiator. Unlike some prior art methods for mounting plates on carriers in which the relief image of the plate is already formed prior to mounting on the carrier, the present method secures photosensitive elements that are uncured or "raw" onto the carrier. The photosensitive element includes an infrared sensitive layer disposed above the photopolymerizable layer (opposite the support) that is capable of forming a mask image based upon digital information. The infrared sensitive layer can be integral with the photosensitive element or can be associated with a separate element which combines to form an assemblage. The uncured photosensitive element associated with the infrared sensitive layer may sometimes be referred to herein as a digital photosensitive element. The present method prepares the composite printing form by providing the digital photosensitive element combined with the carrier with the use of a template having cut out portions. If suitably sized for mounting on the carrier, the photosensitive element can be used as received. The digital photosensitive element has a planar area, that is, a length and a width that is greater than its thickness, and has two substantially flat opposing major faces. Alternatively, the digital photosensitive element can be cut into one or more segments of smaller size/s which will be selectively mounted on or secured to the carrier. The segment(s) of digital photosensitive element that is secured to the carrier forms a relief structure on the carrier that is suitable for printing by the composite printing form. The digital photosensitive element on the carrier is converted to the relief structure on the carrier by conducting a digital method to form an integrated mask image on the photosensitive element which assures precise registration, exposing the photosensitive element with the integrated mask to actinic radiation, and treating to form the relief. Digital methods relate to any method of digitally (i.e., computer-controlled) transferring of graphic information, including text and images, generated from a computer (data file(s)) to the photosensitive element on the composite printing form. In most embodiments, digital methods involve the formation of an image disposed above the photosensitive layer and integrated with the photosensitive element so as to serve as an integrated mask image of opaque areas and clear areas. Digital methods may also be referred to as computer-to-plate technology or methods. Digital methods may also be referred to herein as digital technology, or digital image technology.

As is well known to those skilled in the art, the design of graphic information, including text and images, that is to be printed by the composite printing form is captured and manipulated in computer software to create data files including page layout data. The page layout data can be based upon vector or bitmapped data representing one or more of the locations that graphic information will be printed on the "page" or substrate. The page layout data can be used to determine the number and sizes of the photosensitive elements that are needed for the composite printing form. In some embodiments based on the page layout data, a computer generates a cutting guide for the digital photosensitive element. The cutting guide is a pattern which indicates the cutting of a large photosensitive element into one or more smaller segments, which may be referred to as slugs, according to the size and shape desired for the images being printed by the composite printing form. In one embodiment, the photosensitive element is placed on an automatic cutting table that is connected to the computer and is cut into the appropriate size of slug/s based on the cutting guide. A particularly suitable cutting table is a Kongsberg digital converting table, manufactured by EskoArtwork. In another embodiment, the photosensitive element can be cut manually into the appropriate size of slug/s based on the page layout data. The photosensitive element may be cut to the appropriate sizes required or may be cut to slightly greater size than the size required.

Another step in the present method is forming a template with at least one cut-out portion. The template is formed from a sheet by removing a portion of the sheet to create the cut-out portion. The size of the cut out portion in the template is at least in accordance with the size of the printed image based on the page layout data, but can be adjusted to accommodate the photosensitive elements that were cut slightly oversized. The at least one cutout portions correspond to the at least one locations for the segments of the photosensitive element, i.e., slugs, on the carrier. Thus, the template by having appropriately located cut-out portions for photosensitive elements can roughly register the segments of the photosensitive elements on the carrier. The template is also cut based on the information from the page layout data. A sheet is placed on an automatic cutting table, such as the Kongsberg table, and oriented relative to a reference point on the table. The cutting table includes a computer-driven cutting tool that cuts the sheet at one or more of the locations and at the necessary size determined from the page layout data, and forms cutout portions upon removal of the sheet. In most embodiments, the template has the same or substantially the same size as the carrier. The size of the template is based on a planar area of a width and a length of the sheet used for the template. In other embodiments, the template can have a size that is larger in one or both dimensions of the width and length than the size of the carrier. In other embodiments, the template can have a size that is smaller in one or both dimensions of the width and length of the carrier, provided that the size of the template can accommodate the appropriate holes for registration to the carrier. In some embodiments in which the graphic design of a second composite printing form is similar or the same in placement of the printed images as the first composite printing form, the template can be recycled, or re-used for locating segments of photosensitive element on a second carrier. In most embodiments, one template is used to position the at least one segment of photosensitive element on the carrier. In some embodiments, more than one template may be used, sequentially, to position two or more segments of photosensitive element on the carrier. Materials suitable for use as the sheet are not limited, and can include for example, polymeric films, such as polyester; vinyl; plastic; metal; paper; and cardstock. One embodiment of a suitable sheet for the template is a goldenrod film commonly used in the printing industry to assemble groups of film images in the preparation of printing plates.

The carrier holds and maintains the position of the photosensitive element or of each of the segments of photosensitive element for printing. In most embodiments, the carrier is in sheet form, but is not so limited, and can include cylindrically-shaped forms. The carrier has a size or planar area, that is, a length and a width that is substantially greater than its thickness, and substantially flat opposing major faces, of the sheet used for the carrier. In embodiments where the carrier is cylindrically-shaped, the size is based on a surface area of an exterior surface of the cylindrically-shaped carrier that secures the at least one photosensitive element (excludes end surfaces of the cylinder), wherein a length is comparable to a perimeter of the exterior surface of the cylindrical carrier and a width is comparable to a height of the cylindrical carrier. Since in the present invention the carrier sheet is not marked, in some embodiments the carrier of a first composite printing form can be recycled, or re-used in a second composite printing form after the segment(s) of photosensitive element is removed from the carrier of the first composite printing form. (If the carrier is re-used, irreversibly marking the carrier with registration indicators can create confusion on the placement of the segments of photosensitive element for the second composite printing form.) Materials suitable for use as the sheet carrier can be any which are flexible to wrap about the print cylinder, resistant to deformation and stretching particularly during printing, and resistant to deformation or size change upon treating. Examples of materials suitable as the carrier include, but are not limited to, vinyl plastics, linoleum, metal, and polymeric films, such as polyester. Suitable thickness of the carrier is form 0.005 to 0.185 inch (0.013 to 0.47 cm). In many embodiments, the carrier is a polymeric film of polyvinylchloride (PVC) or polyethylene terephthalate that has a thickness from 0.010 to 0.030 inch (0.025 to 0.076 cm). Materials suitable for use as the cylindrically-shaped carrier can be any supports that are for use in cylindrical printing forms, commonly referred to as print sleeves or sleeves. The type of sleeve or cylindrical support is not limited by the present invention. The sleeve may be formed from single layer or multiple layers of flexible material. In some embodiments, flexible sleeves made of polymeric films are suitable. In other embodiments, sleeves of metal, such as nickel; or glass epoxy, are suitable. The sleeve can have a wall thickness from less than 10 mils (0.025 cm) to 80 mils (0.203 cm) or more. It is also contemplated that opposing ends of the carrier sheet can be joined by any appropriate means, such as for example, melt fusing, taping, stitching, clamping, stapling, taping, gluing, and sewing, to form a cylindrically-shaped carrier. The carrier can be formed into a cylindrical shape prior to, but preferably after, the photosensitive elements are secured to the carrier sheet. The carrier itself is not modified to carry registration information i.e., the location information of the at least one photosensitive elements being mounted on the carrier.

Both the carrier (in sheet form) and the template have leading ends where at least two openings or holes are located. The at least two holes are spaced apart in a row located near and parallel to the leading end. The size, the shape, and number of the holes (beyond the at least two holes) are not particularly limited for the purposes of the present invention. The at least two holes in the leading ends of the carrier and the template provide the capability to register the template to the carrier. The at least two holes in the leading ends of the carrier can also be used to secure the carrier to a mounting bar for mounting and to assure registration of the carrier on a printing cylinder. The holes in the leading end of the carrier and the template can be machined, punched, or drilled by conventional equipment. Sources of conventional punching equipment are manufacturers of film punches for the printing industry such as Stoesser, Burgess Industries, and Carlson. After punching holes in each of the leading ends of the carrier and the template, the template is positioned adjacent the carrier. In most embodiments, the template is positioned on top of the carrier so that the cut-out portions can be seen and accessed. In other embodiments where the carrier is made of a transparent material, the carrier may be positioned on top of the template so that the cutout portions can be seen. In one embodiment, the template is positioned adjacent the carrier by temporarily mounting the carrier to a pin bar by aligning the at least two holes in the leading end on at least two pins on the bar, and placing the template on top of the carrier by locating the at least two holes in the leading end of the template with the corresponding pins in the bar, to align the template with the carrier.

In embodiments where the carrier is cylindrically-shaped, the carrier may be (pre) mounted onto a support cylinder associated with an imaging or other apparatus and may itself include a reference mark or other means by which the template is aligned and positioned adjacent the cylindrical carrier. The template may be held in position on the carrier while mounting the segment/s by taping or pinning one or more ends of the template to the carrier.

The method includes securing the photosensitive element to the carrier by inserting the element within the cutout portion of the template. If more than one photosensitive element is to be secured on the carrier, the step of securing the photosensitive element by inserting the element within the cutout portion is repeated as many times as necessary for each of the segments of photosensitive element. Each of the segments of photosensitive element is inserted into the corresponding, appropriately-sized cut-out portion of the template, to reside securely on the carrier in a position that will allow for registration of the image by a digital method. Thus, one or more of the digital photosensitive elements are mounted on the carrier in approximate register via the template as a guide to areas that will ultimately print a substrate. The segment of photosensitive element is mounted onto the carrier such that the side of the element opposite the infrared sensitive layer (or that will have the integrated mask) resides on or is adjacent the carrier. In most embodiments, the support of the photosensitive element will be adjacent the carrier. The photosensitive element need not be mounted with any particular degree of precision, but located within the associated cut-out portion of the template. All that is required is that the photosensitive element be secured or mounted on those portions of the carrier that ultimately will bear relief images. Accurate registration is achieved for the composite printing form by the computer-controlled digital transfer of graphic information to an exterior surface of the photosensitive element (opposite the support) that has been mounted on the carrier.

The photosensitive elements can be secured or mounted using any of the many means known to those skilled in the art. Most embodiments involve applying double-sided adhesive tape or some other suitable adhesive to the photosensitive element, to the carrier at the cutout location according to the template, or to both. In some embodiments, the double-sided adhesive tape is applied to the support of the photosensitive element. In other embodiments, the support is removed from the photosensitive element and the double-sided adhesive tape is applied to a surface of the photosensitive element where the support was previously. The template is removed or separated from the carrier once the segment/s of photosensitive element is inserted through the template and secured to the carrier.

In preparation for the next step of the method, which is to overall expose the photosensitive element to actinic radiation through a mask, an in-situ mask image is formed on or disposed above the surface of the photopolymerizable layer opposite the support. The in-situ mask may also be referred to as an integrated mask image. The IR-sensitive layer can itself form an integrated masking layer for the photosensitive element or can be used in conjunction with one or more adjacent (radiation opaque) layers to form the integrated mask layer on the element. The mask includes opaque areas and "clear" areas that form the image. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. The image necessary for the imagewise exposure of the photopolymerizable layer can be generated by any digital method. Precise registration of the relief images in the photosensitive element on the carrier is achieved through the formation of the integrated mask image on the elements by digital techniques conducted after the element is approximately located and secured to the carrier.

The digital photosensitive element includes an infrared sensitive layer, which in some embodiments can also function as an actinic radiation opaque layer, that is used in digital image technology in which laser radiation is used to form a mask for the photosensitive element (instead of the conventional phototool film image). Digital methods create a mask image in situ on or disposed above the photopolymerizable layer with laser radiation. Digital methods of creating the mask image require one or more steps to prepare the photosensitive element prior to imagewise exposure. Generally, digital methods of in situ mask formation either selectively remove or transfer the radiation opaque layer, from or to a surface of the photosensitive element opposite the support. The presence of materials in the infrared sensitive layer that are black, such as dark inorganic pigments, such as carbon black and graphite, mixtures of pigments, metals, and metal alloys function as both infrared-sensitive material and radiation-opaque material. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. The in situ mask images remain on the photosensitive element for subsequent steps of overall exposure to actinic radiation. One suitable infrared laser exposure apparatus used for digital formation an in-situ mask on a surface of the photosensitive element is a CYREL® Digital Imager (sold by EskoArtwork, from Gent, Belgium). Conventionally, the laser exposure apparatus includes a rotating drum having a clamp that holds one end of a planar photosensitive printing element, and securely mounts the element to the drum during laser imaging. The drum may include a second clamp for holding an opposite end of the planar element. The drum and/or the clamp of a laser exposure apparatus may be modified to accommodate mounting of the composite printing form. In one embodiment, a removable mounting bar can be used for mounting the composite printing form in the laser exposure apparatus. The removable mounting bar has a length that is the same or substantially the same as a length of the clamp on the drum (i.e., width). Along its length, the mounting bar includes one or more openings to align to the drum and one or more raised pins to align the composite print form to the mounting bar (and drum). The drum may have one or more pins at or adjacent the clamp that mate with the one or more openings in the mounting bar. The mating of the drum pin/s with the opening/s in the mounting bar registers the mounting bar to the drum (and laser). The raised pins on the mounting bar are positioned to correspond to the holes at the leading end of the carrier. The composite print form is secured to the drum by engaging the holes at the leading end of the carrier with the raised pins on the mounting bar and capturing the leading end of the carrier with the clamp. Along its length, portions of the clamp may be cutaway to accommodate the raised pins on the mounting bar when the mounting bar and the composite printing form are secured by the clamp. In some embodiments, the mounting bar for the drum is separate and distinct from a mounting bar used to secure the composite print form to a print cylinder. In other embodiments, the drum and clamp of the laser exposure apparatus may be modified to accommodate a mounting bar, which is the same as the mounting bar used to secure the composite print form to a print cylinder.

In one digital method, the photosensitive element will initially include the infrared sensitive layer that covers or substantially covers the entire surface of the photopolymerizable layer. The infrared sensitive layer is exposed imagewise to infrared laser radiation to form the image on or disposed above the photopolymerizable layer, i.e., the in situ mask. The infrared laser radiation can selectively remove, e.g., ablate or vaporize, the infrared sensitive layer (i.e., radiation opaque layer) from the photopolymerizable layer, as disclosed by Fan in U.S. Pat. Nos. 5,262,275 and 5,719,009; and Fan in EP 0 741 330 B1. A material capture sheet adjacent the infrared sensitive layer may be present during laser exposure to capture the material as it is removed from the photosensitive element as disclosed by Van Zoeren in U.S. Pat. No. 5,506,086. Only the portions of the infrared sensitive layer that were not removed from the photosensitive element will remain on the element forming the in situ mask of radiation opaque material.

In another digital method of mask formation, the photosensitive element will not initially include the infrared sensitive layer. A separate element bearing the infrared sensitive layer as a radiation opaque layer will form an assemblage with the photosensitive element such that the radiation opaque layer is adjacent the surface of the photosensitive element opposite the support, which is typically the photopolymerizable layer. (If present, a coversheet associated with the photopolymerizable layer is removed prior to forming the assemblage). The separate element may include one or more other layers, such as ejection layers or heating layers, to aid in the digital exposure process. These other layers may also be considered an infrared sensitive layer. Hereto, the radiation opaque layer is also sensitive to infrared radiation. The assemblage is exposed imagewise with infrared laser radiation to selectively transfer the radiation opaque layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. Only the portions of the radiation opaque layer which were transferred will reside on the photosensitive element forming the in situ mask.

Further, the mask image may be created on a separate carrier and then transferred by application of heat and/or pressure to the surface of the photopolymerizable layer opposite the support. The photopolymerizable layer is typically tacky and will retain the transferred image. Optionally, the separate carrier can then be removed from the element prior to imagewise exposure. The separate carrier may have an infrared sensitive layer which is also a radiation opaque layer or associated with a radiation opaque layer, that is imagewise exposed to infrared laser radiation to selectively remove the radiation opaque material and form the image. An example of this type of separate carrier is LaserMask® imaging film by Rexam, Inc. Alternatively, the image of radiation opaque material may be transferred to the separate carrier from another element having the radiation opaque material by laser radiation. The separate carrier may include at least two holes along its leading edge for locating the separate carrier on the pin bar adjacent the carrier and in alignment with the photosensitive elements secured to the carrier.

The imagewise exposure with infrared laser radiation can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The integrated mask image(s) remain on the photosensitive element for subsequent step of overall exposure to actinic radiation.

The next step of the process of the present invention is to overall expose the photosensitive element to actinic radiation through the integrated mask image, that is, imagewise exposure of the element through the digitally formed mask. The photosensitive element of the present invention is exposed through the mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° to about 35° C. Exposure is of sufficient duration to crosslink the exposed areas down to the support or to the back exposed layer, i.e., floor. Imagewise exposure time is typically much longer than backflash exposure time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the photosensitive element. The preferred photosensitivity of most common photosensitive elements for relief printing are in the UV and deep UV area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/HO/180, 115 w), and the Philips UV-A "TL"-series low-pressure mercury-vapor fluorescent lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310-400 nm. Flexographic printing plates sensitive to these particular UV sources use photoinitiators that absorb between 310-400 nm.

Imagewise exposure of the photosensitive element having the in-situ mask to actinic radiation is not limited, and may be conducted in the presence of atmospheric oxygen, or in the absence of atmospheric oxygen, or in an atmosphere having a controlled amount of oxygen less than atmospheric. Atmospheric oxygen is eliminated when the exposure is conducted in a vacuum. The exposure may be conducted in a vacuum to minimize the effects of oxygen on the polymerization reactions occurring in that layer. The exposure may be conducted in the presence of atmospheric oxygen since the mask is formed in situ or applied imagewise with radiation opaque material on the photopolymerizable layer, there is no need for vacuum to assure intimate contact of the in-situ mask. In some embodiments of the process of preparing the composite printing form, the overall exposure step is conducted without vacuum, i.e., while the photosensitive element is in the presence of atmospheric oxygen, and without any additional layers present on top of the in-situ mask. In other embodiments of the process of preparing the composite printing form, the overall exposure step is conducted in an atmosphere having an inert gas and a controlled amount of oxygen less than atmospheric oxygen. Suitable methods of overall exposing the digital photosensitive element in an environment having an inert gas and a controlled oxygen concentration in a range between 190,000 parts per million (ppm) and 100 ppm is described in U.S. Ser. No. 12/349,608, filed Jan. 7, 2009; and U.S. Ser. No. 12/401,106, filed Mar. 10, 2009.

The process of the invention usually includes a back exposure or backflash step. This is a blanket exposure to actinic radiation through the support of the photosensitive element. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes. The back exposure step can be performed after securing the photosensitive element to the carrier providing that the carrier and the mounting means are sufficiently transparent to actinic radiation, but in most embodiments the back exposure is performed before the photosensitive element is secured to the carrier.

Following overall exposure to UV radiation through the mask, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. For photosensitive elements having the integrated mask image, the treating step also removes the mask image (which had been exposed to actinic radiation) and the underlying unexposed areas of the photopolymerizable layer.

Treatment of the photosensitive printing element includes (1) "wet" development wherein the photopolymerizable layer is contacted with a suitable developer solution to washout unpolymerized areas and (2) "dry" development wherein the photosensitive element is heated to a development temperature which causes the unpolymerized areas of the photopolymerizable layer to melt or soften or flow and is wicked away by contact with an absorbent material. Dry development may also be called thermal development.

Wet development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the unexposed portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary however typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to soften or melt or flow, and contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98/13730.

The term "melt" is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with an absorbent material can be done at the same time, or in sequence provided that the uncured portions of the photopolymerizable layer are still soft or in a melt state when contacted with the absorbent material. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the absorbent material with the photopolymerizable layer that is molten in the uncured regions, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the photopolymerizable layer (while in the uncured portions are melt) may be maintained by the pressing the layer and the absorbent material together.

A preferred apparatus to thermally develop the photosensitive element is disclosed by Peterson et al. in U.S. Pat. No. 5,279,697, and also by Johnson et al. in Patent Cooperation Treaty Application No. PCT/US00/24400 filed Sep. 6, 2000 (IM-1289 PCT). The photosensitive element may be placed on a drum or a planar surface in order for thermal treatment to be carried out.

The absorbent material is selected having a melt temperature exceeding the melt temperature of the uncured portions of the photopolymerizable layer and having good tear resistance at the same operating temperatures. Preferably, the selected material withstands the temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition. Preferred is a non-woven nylon web.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

The photosensitive printing elements of the present invention can be uniformly post-exposed to actinic radiation ensure that the photopolymerization process is complete and that the element will remain stable during printing and storage. This post-exposure step can utilize the same radiation source as the main overall exposure.

Detackification is an optional post-development treatment that can be applied if the surface of the photosensitive printing element is still tacky, such tackiness not generally being removed in post-exposure. Tackiness can be eliminated by methods well known in the art, such as treatment with bromine or chlorine solutions. Preferably, detackification is accomplished by exposure to radiation sources having a wavelength not longer than 300 nm, as disclosed in European Published Patent Application 0 017927 and Gibson U.S. Pat. No. 4,806,506.

After treatment, the thus prepared composite printing form is then ready for mounting onto a printing cylinder. The method for mounting the composite printing form is not limited. One method for mounting relief printing form onto a printing cylinder attaches a mounting bar to the leading edge of the composite printing form via removable pins inserted in the leading edge holes and the mounting bar, as described by Fox et al. in U.S. Pat. No. 5,562,039. Other methods of securing the mounting bar to the leading edge of the composite printing form include sewing, gluing, clamping, etc. The mounting bar provides the capability to secure the composite printing form to the printing cylinder, in register with the substrate, and as needed with a multi-colored image.

Photosensitive Element

The photosensitive element used for preparing flexographic printing forms includes at least one layer of a photopolymerizable composition. The term "photosensitive" encompass any system in which the at least one photosensitive layer is capable of initiating a reaction or reactions, particularly photochemical reactions, upon response to actinic radiation. In some embodiments, the photosensitive element includes a support for the photopolymerizable layer. In some embodiments, the photopolymerizable layer is an elastomeric layer that includes a binder, at least one monomer, and a photoinitiator. In some embodiments, the photosensitive element includes a layer of an infrared sensitive material which can also function as an actinic radiation opaque material adjacent the photopolymerizable layer, opposite the support.

Unless otherwise indicated, the term "photosensitive element" encompasses printing precursors capable of undergoing exposure to actinic radiation and treating to form a surface suitable for printing. Unless otherwise indicated, the "photosensitive element" and "printing form" includes elements or structures in any form which become suitable for printing or are suitable for printing, including, but not limited to, flat sheets, plates, plates-on-sleeves, and plates-on-carriers. It is contemplated that printing form resulting from the photosensitive element has end-use printing applications for relief printing, such as flexographic and letterpress printing. Relief printing is a method of printing in which the printing form prints from an image area, where the image area of the printing form is raised and the non-image area is depressed.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a binder, at least one monomer, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for flexographic printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. In most embodiments, a solid layer of the photopolymerizable composition is unpolymerized, but can include some embodiments where the photopolymerizable composition may be polymerized (photohardened), or both polymerized and unpolymerized.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. In some embodiments, the elastomeric binders include poly(styrene/isoprene/styrene)block copolymers and poly(styrene/butadiene/styrene)block copolymers. The binder can be soluble, swellable, or dispersible in aqueous, semi-aqueous, water, or organic solvent washout solutions. Generally, the elastomeric binders which are suitable for washout development are also suitable for use in thermal treating wherein the unpolymerized areas of the photopolymerizable layer soften, melt, or flow upon heating.

The photopolymerizable composition contains at least one compound capable of addition polymerization that is compatible with the binder to the extent that a clear, non-cloudy photosensitive layer is produced. The at least one compound capable of addition polymerization may also be referred to as a monomer. Monomers that can be used in the photopolymerizable composition are well known in the art and include, but are not limited to, addition-polymerization ethylenically unsaturated compounds with at least one terminal ethylenic group. The composition can contain a single monomer or a combination of monomers. Monomers can be appropriately selected by one skilled in the art to provide suitable elastomeric and other properties to the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the type of printing form desired. In some embodiments, the photosensitive layer can have a thickness from about 0.002 inch to about 0.250 inch or greater (about 0.051 mm to about 0.64 cm or greater). Typical thickness of the photopolymerizable layer is from about 0.010 inches to about 0.250 inches (about 0.025 cm to about 0.64 cm). In some embodiments, the photosensitive layer can have a thickness from about 0.107 inch to about 0.300 inch (about 0.27 to about 0.76 cm).

The photosensitive element typically includes a support adjacent the layer of the photopolymerizable composition. The support can be composed of any material or combination of materials that is conventionally used with photosensitive elements used to prepare printing forms. In some embodiments, the support is transparent to actinic radiation to accommodate "backflash" exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. In some embodiments, the support is a polyester film. In one embodiment, the support is polyethylene terephthalate film. In some embodiments, the support has a thickness from 0.002 to 0.050 inch (0.0051 to 0.127 cm). In other embodiments, the thickness for the sheet form support is 0.003 to 0.016 inch (0.0076 to 0.040 cm).

Optionally, the element includes an adhesive layer between the support and the photopolymerizable layer, or a surface of the support that is adjacent the photopolymerizable layer has an adhesion promoting surface. Further, the adhesion of the photopolymerizable layer to the support can be adjusted by exposing the element to actinic radiation through the support as disclosed by Feinberg et al. in U.S. Pat. No. 5,292,617.

Typically, plate-on-sleeve is a photosensitive element that includes at least the composition layer on a planar support, i.e., a plate, which is then mounted onto a cylindrically-shaped support. Ends of the plate may or may not meet or join when wrapped onto the sleeve. Plate-on-sleeve also includes an embodiment in which more than one plate, or portions of plates, are mounted onto a sleeve at various spaced locations.

As is well known to those of ordinary skill in the art, the photosensitive element may include one or more additional layers adjacent the photopolymerizable layer, that is, on a side of the photopolymerizable layer opposite the support. Depending on desired use, the additional layers may be opaque or transparent to actinic radiation, and may have one or more functions for the photosensitive element. The additional layers include, but are not limited to, a release layer, an elastomeric capping layer, a barrier layer, an adhesion modifying layer, a layer which alters the surface characteristics of the photosensitive element, and combinations thereof. The one or more additional layers can be removable, in whole or in part, during treatment. One or more of the additional layers may cover or only partially cover the photosensitive composition layer. It is well within the ordinary skill of those in the art to select and prepare additional layers on the photopolymerizable layer according to desired end-use.

In one embodiment, the photosensitive element includes the infrared sensitive layer which is also an actinic radiation opaque layer disposed above a surface of the photopolymerizable layer opposite the support. The actinic radiation opaque layer may substantially cover the surface or only cover an imageable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer. If present, the barrier layer can minimize migration of materials between the photopolymerizable layer and the radiation opaque layer. The actinic radiation opaque layer is also sensitive to laser radiation that can selectively remove or transfer the opaque layer. In one embodiment, the actinic radiation opaque layer is sensitive to infrared laser radiation. The actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which is not limited. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film; most preferably the coversheet is 5-mil Mylar@.

The photosensitive element on the composite printing form, after exposure (and treating) of the photosensitive element, has a durometer of about 20 to about 80 Shore A. In some embodiments, the (exposed and treated) photosensitive element on the composite printing form has a durometer of 30 to 50 Shore A. The Shore durometer is a measure of the resistance of a material toward indentation. Durometer of Shore A is the scale typically used for soft rubbers or elastomeric materials, where the higher the value the greater the resistance toward penetration. The durometer of the printing form can be measured according to standardized procedures described in DIN 53,505 or ASTM D2240-00.

What is claimed is:

1. A method for preparing a composite printing form, comprising
   a) providing a photosensitive element comprising a layer of a photopolymerizable composition and an infrared sensitive layer disposed above the photopolymerizable layer;
   b) forming a template from a sheet by removing a portion of the sheet to form a cut-out portion;
   c) positioning the template adjacent a carrier;
   d) securing the element to the carrier by inserting the element within the cut-out portion of the template;
   e) imagewise exposing the infrared sensitive layer with infrared laser radiation to form a mask on the element;
   f) overall exposing the element to actinic radiation through the mask; and
   g) treating the element of f) to form a relief structure on the carrier.

2. The method of claim 1 further comprising cutting the element of step a) into two or more element portions, and wherein the forming step is performed by removing two or more portions of the sheet to form the two or more cut-out portions, the two or more cut-out portions approximately corresponding in size to the two or more element portions.

3. The method of claim 1 wherein the forming step comprises determining a location of the cut-out portion in the template from page layout data.

4. The method of claim 3 wherein the forming step further comprises placing the sheet on a cutting table comprising a computer-controlled cutting assembly having a knife, and cutting the sheet at the location with the knife.

5. The method of claim 2 wherein the cutting of the element of step a) comprises placing the element on a cutting table comprising a computer-controlled cutting assembly having a knife, and moving the knife on the element to form the two or more element portions.

6. The method of claim 1 further comprising punching at least two registration holes in a leading edge of the carrier.

7. The method of claim 1 further comprising punching at least two registration holes in a leading edge of the template.

8. The method of claim 6 further comprising punching at least two registration holes in a leading edge of the template, and wherein the positioning step c) comprises aligning the registration holes of the template with the registration holes of the carrier.

9. The method of claim 1 further comprising attaching a mounting bar to an end of the element of step g).

10. The method of claim 1 wherein the imagewise exposing step e) comprises ablating the infrared sensitive layer from the photopolymerizable layer.

11. The method of claim 1 wherein the imagewise exposing step e) comprises transferring the infrared sensitive layer to a surface of the photopolymerizable layer opposite the support.

12. The method of claim 1 wherein the carrier is transparent to the actinic radiation, the method further comprising exposing the element to the actinic radiation through the carrier.

13. The method of claim 1 wherein after step g), further comprising removing the element from the carrier, and re-using the carrier in preparing a second composite printing form with a second photosensitive element according to steps b) through g).

14. The method of claim 1 further comprising re-using the template in preparing a second composite printing form with a second photosensitive element according to steps c) through g).

15. The method of claim 1 further comprising prior to step d), attaching a mounting bar to the leading end of the carrier, and securing the mounting bar with the carrier on a drum in register by the imagewise exposure.

* * * * *